(12) United States Patent
Kim

(10) Patent No.: US 10,032,657 B2
(45) Date of Patent: Jul. 24, 2018

(54) APPARATUS AND METHOD FOR TREATING A SUBSTRATE

(71) Applicant: SEMES CO., LTD., Chungcheongnam-do (KR)

(72) Inventor: Jaeyong Kim, Chungcheongnam-do (KR)

(73) Assignee: SEMES CO., LTD., Chungcheo, Ngnam-Do (KR)

( * ) Notice: Subject to any disclaimer, the term of this patent is extended or adjusted under 35 U.S.C. 154(b) by 0 days.

(21) Appl. No.: 15/363,062

(22) Filed: Nov. 29, 2016

(65) Prior Publication Data
US 2017/0153550 A1    Jun. 1, 2017

(30) Foreign Application Priority Data

Nov. 30, 2015  (KR) .................. 10-2015-0169337

(51) Int. Cl.
*H01L 21/67* (2006.01)
*G03F 7/16* (2006.01)
*G03F 7/20* (2006.01)

(52) U.S. Cl.
CPC .......... *H01L 21/67051* (2013.01); *G03F 7/16* (2013.01); *H01L 21/67* (2013.01); *H01L 21/6704* (2013.01)

(58) Field of Classification Search
CPC ............................................. H01L 21/67051
See application file for complete search history.

(56) References Cited

U.S. PATENT DOCUMENTS

2014/0116478 A1*  5/2014  Higashijima ..... H01L 21/67051
                                              134/104.2

FOREIGN PATENT DOCUMENTS

| JP | H08-022974 A | 1/1996 |
|---|---|---|
| JP | 2001-147540 A | 5/2001 |
| JP | 2002-301413 A | 10/2002 |
| JP | 2009-277870 A | 11/2009 |
| JP | 2010-186859 A | 8/2010 |
| JP | 2012-064800 A | 3/2012 |
| KR | 2008-0011792 A | 2/2008 |
| KR | 10-2009-0015332 A | 2/2009 |
| KR | 10-0895032 B1 | 4/2009 |
| KR | 10-0923268 B1 | 10/2009 |
| KR | 10-2011-0080935 A | 7/2011 |

OTHER PUBLICATIONS

Examination Report for corresponding Korean Patent Application No. 10-2015-0169337 dated Sep. 29, 2017.

* cited by examiner

*Primary Examiner* — Michelle M Iacoletti
(74) *Attorney, Agent, or Firm* — Carter, Deluca, Farrell & Schmidt, LLP

(57) ABSTRACT

The present disclosure relates to an apparatus and a method for treating a substrate with a liquid. A substrate treating apparatus includes a substrate supporting unit having a supporting plate for supporting a substrate and a bottom liquid supply unit for supplying a liquid to a bottom of the substrate supported by the supporting plate, wherein the bottom liquid supply unit includes a body and a liquid discharge nozzle for discharging a treatment liquid to the bottom of the substrate and coupled to the body and wherein an upper surface of the body includes a drainage hole for draining a liquid remaining in the body. Accordingly a liquid remained in the body may be discharged through the drainage hole.

21 Claims, 12 Drawing Sheets

APPARATUS AND METHOD FOR TREATING A SUBSTRATE

CROSS-REFERENCE TO RELATED APPLICATIONS

A claim for priority under 35 U.S.C. § 119 is made to Korean Patent Application No. 10-2015-0169337 filed on Nov. 30, 2015 in the Korean Intellectual Property Office, the entire contents of which are hereby incorporated by reference.

BACKGROUND OF THE INVENTION

The present invention disclosed herein relates to an apparatus and method for treating a substrate with a liquid.

Variety processes such as photolithography, deposition, ashing, etching, and ion implanting, etc. are performed in a manufacturing process of semiconductor device. Also, a cleaning process for cleaning a particle remaining in a substrate is performed before and after those above processes.

The cleaning process is performed by supplying a cleaning liquid to both sides of the substrate which is supported by a spin head. A bottom of the substrate is treated with a cleaning process by a nozzle member which is positioned between the spin head and the substrate.

Referring to FIGS. 1 and 2, the nozzle member 4 comprises a plurality of nozzle members 6 and a body 8. The plurality of nozzles 6 are coupled to the body 8 and comprise an outlet facing upward. Each nozzle is positioned adjacently to each other to discharge a liquid to a center of a substrate W. Liquids discharged from nozzles to the center of the substrate W are spread to an edge of the substrate W by centrifugal force.

However, some of the discharged liquids are scattered from the substrate to the body and remained in the body. Especially, remained liquids in a space between nozzles are not easily drained. As time goes by, size of remained liquids gets bigger and when it becomes certain size, it gets popped and attached to the bottom of the substrate. This may cause a drying error of the substrate. Also, liquids remaining in the body and having a different property from each other react with each other and generate a fume which contaminates the substrate.

SUMMARY OF THE INVENTION

The present invention provides an apparatus and a method for removing liquids remained in a nozzle member for discharging a liquid at a bottom of a substrate.

An embodiment of the present invention provides a method and an apparatus for treating a substrate with a liquid. A substrate treating apparatus comprises a substrate supporting unit comprising a supporting plate for supporting a substrate and a bottom liquid supply unit for supplying a liquid to a bottom of the substrate supported by the supporting plate, wherein the bottom liquid supply unit may comprise a body and a liquid discharge nozzle for discharging a treatment liquid to the bottom of the substrate and coupled to the body and wherein a drainage hole for draining a liquid remaining in the body is formed at an upper surface of the body.

The bottom liquid supply unit may further comprise a suction member providing a sound pressure to the drainage hole. The liquid discharge nozzle may be provided with a plurality of numbers and the drainage hole may be positioned between two adjacent liquid discharge nozzles.

Also the liquid discharge nozzle may be provided with a plurality of numbers and may be positioned between a center axis of the body and the liquid discharge nozzles.

Also the liquid discharge nozzle may be provided with a plurality of numbers and the drainage hole may be positioned further apart from a center of the body than the liquid discharge nozzles.

An outlet the liquid discharge nozzles may be positioned higher than the drainage hole. The body may be inserted in the supporting plate so that an upper surface of the body may protrude upward from the supporting plate and may be positioned independently from the supporting plate. A top groove may be formed in the upper surface of the body, the liquid discharge nozzle may be positioned in the top groove, and the drainage hole may be formed in a bottom of the top groove. The bottom liquid supply unit may further comprise a gas nozzle containing a lateral discharge line for discharging laterally and/or obliquely (downwardly) a gas and coupled to the body, wherein the lateral discharge line may be provided to penetrate a sidewall of gas nozzle. The gas nozzle may further comprise a top discharge line for discharging upwardly a gas to a bottom of the substrate. The lateral discharge line may be branched off from the top discharge line. The gas nozzle may be positioned closer to a center axis of the body than the liquid discharge nozzle, when viewed from a top side, and wherein the lateral discharge line may be provided with a plurality of numbers spaced apart along an outer circumference of the gas nozzle. The liquid discharge nozzles may be positioned to surround the gas nozzle, when viewed from a top side. The lateral discharge line may be provided to a height close to an upper surface of the body and may be provided to inject a gas to a direction parallel with the upper surface of the body.

Also, the lateral discharge line may be provided to have a descending slope for a gas to be discharged from the upper side of the body to interspace of the gas nozzle and the drainage hole.

Also, a substrate treating apparatus comprises a substrate supporting unit comprising a supporting plate for supporting a substrate and a bottom liquid supply unit providing a liquid to a bottom of the substrate supported by the supporting plate, wherein the bottom liquid supply unit further comprises a body, a liquid discharge nozzle for discharging a treatment liquid to a bottom of the substrate and coupled to the body, and a gas nozzle containing a lateral discharge line from which a gas is discharged and coupled to the body, and wherein the lateral discharge line is provided to penetrate a sidewall of the gas nozzle.

The gas nozzle may be positioned closer to a center axis of the body than the liquid discharge nozzle, when viewed from a top side, and wherein the lateral discharge line may be provided with a plurality of numbers spaced apart along an outer circumference of the gas nozzle. A drainage hole for draining a liquid remaining at the body may be formed in upper surface of the body. The bottom liquid supply unit may further comprise a suction member for providing a negative pressure to the drainage hole. The liquid discharge nozzle may be provided with a plurality of numbers and the drainage hole may be positioned between adjacent two liquid discharge nozzles.

Also, the liquid discharge nozzle may be provided with a plurality of numbers and the drainage hole may be positioned between the gas nozzle and the liquid discharge nozzle.

Also, the liquid discharge nozzle may be provided with a plurality of numbers and the drainage hole may be positioned further apart from the gas nozzle than the liquid discharge nozzles.

A method for treating a substrate by using the substrate treating apparatus comprises discharging a liquid to a bottom of the substrate and discharging a gas from the gas nozzles to remove a remaining liquid in the body.

Discharging a gas from the gas nozzles may comprise discharging the gas from the gas nozzles to blow the remained liquid and discharge the remained liquid to the drainage hole. The remained liquid may be sucked by a negative pressure provided in the drainage hole.

According to an embodiment of the present invention, a drainage hole is formed in the body which is provided to a supporting plate in order to support a nozzle for cleaning a bottom of the substrate and thereby a liquid remaining in the body may be discharged through the drainage hole.

Also, according to an embodiment of the present invention, a liquid remaining in the body may be removed by a gas discharged from a gas nozzle supported in the body to an upper surface of the body.

DETAILED DESCRIPTION

Various example embodiments will be described more fully hereinafter with reference to the accompanying drawings, in which some example embodiments are shown. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Therefore, features of the drawings are exaggerated to emphasize definite explanation.

Hereinafter, embodiments of the present invention are explained in detail referring to FIGS. 3 to 13.

Figure 1:
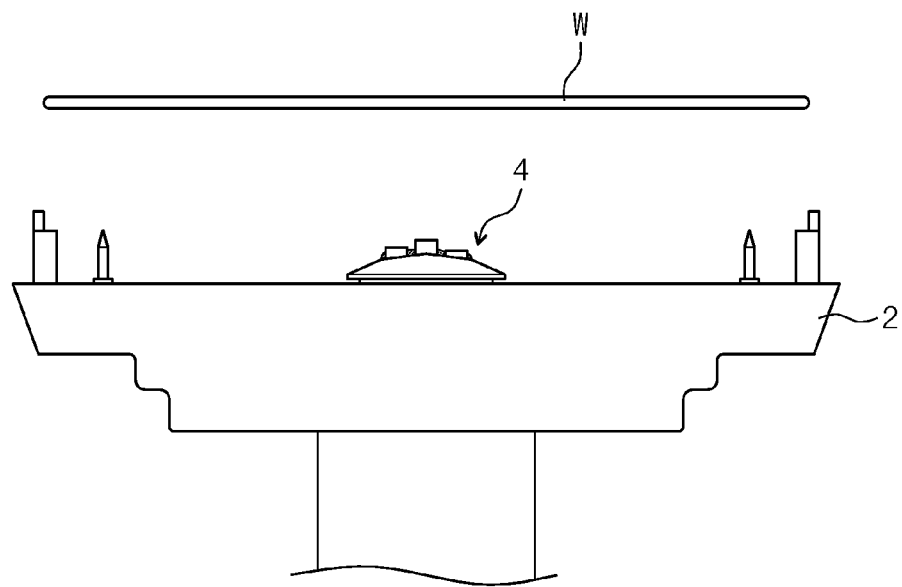
FIG. 1 is a cross sectional view of a conventional cleaning member.
Figure 2:
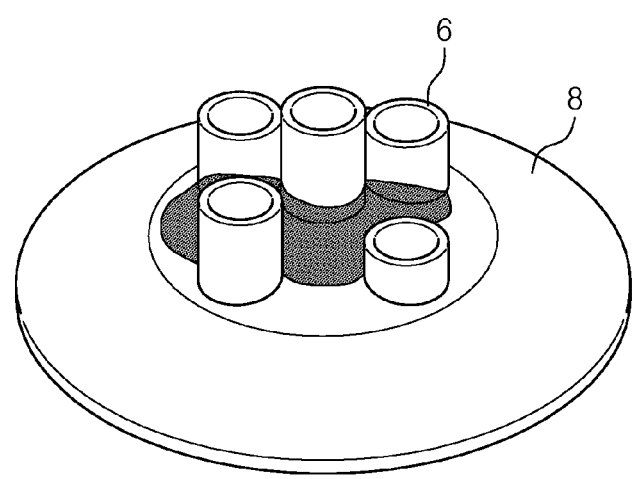
FIG. 2 is a perspective view of a cleaning member of FIG. 1.
Figure 3:
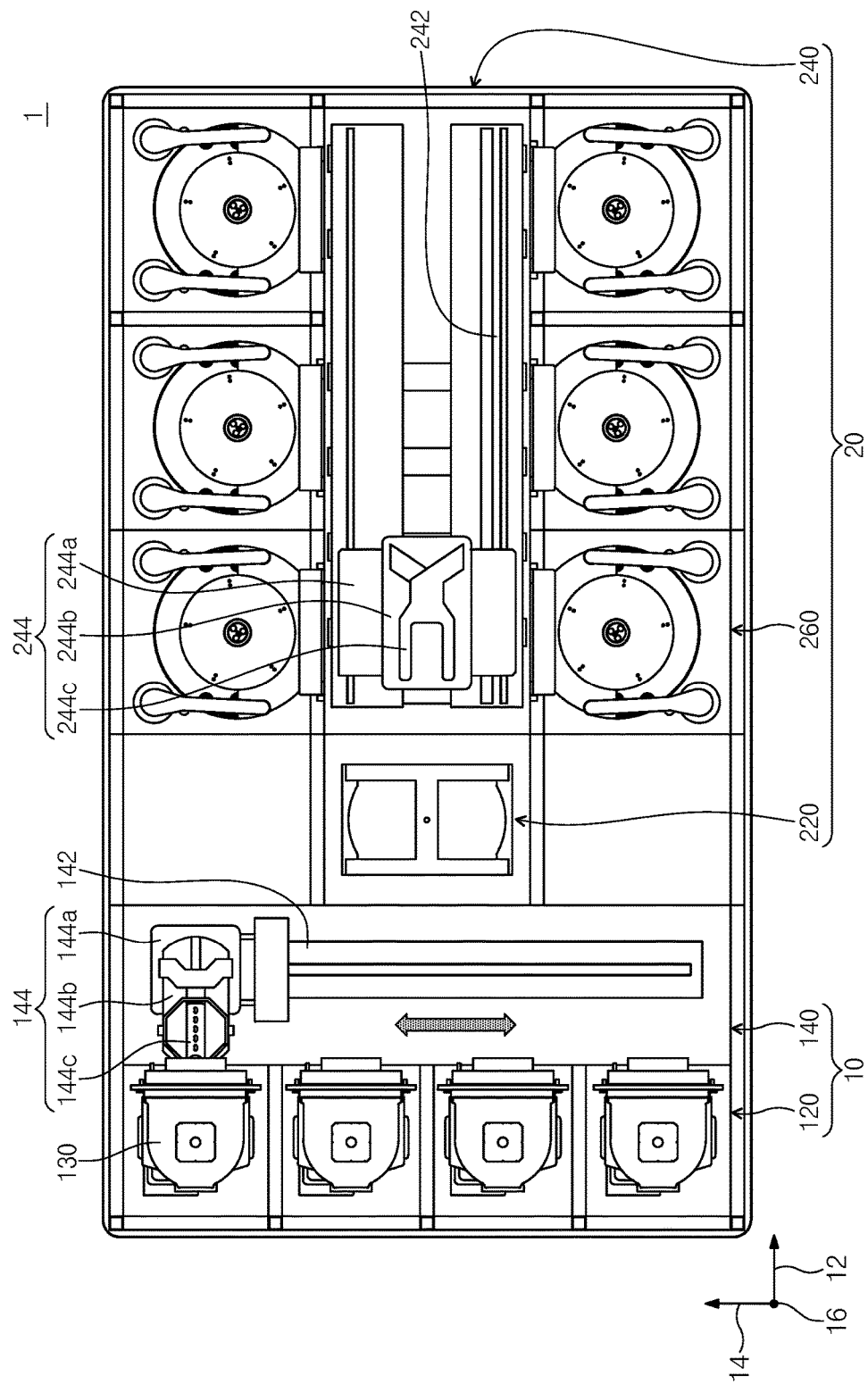
FIG. 3 is a plan view of a substrate treating apparatus in accordance with an embodiment of the present invention.

FIG. 3 is a plan view of a substrate treating apparatus in accordance with an embodiment of the present invention. Referring to FIG. 3, a substrate treating apparatus 1 comprises an index module 10 and a process treating module 20. The index module 10 comprises a load port 120 and a transfer frame 140. The load port 120, the transfer frame 140, and the process treating module 20 are sequentially arranged in a line. Hereinafter, a direction where the load port 120, the transfer frame 140, and the process treating module 20 are arranged is referred to as a first direction 12. And a direction perpendicular to the first direction 12 is referred to as a second direction 14, when view from a top side, and a direction perpendicular to a plane including the first direction 12 and the second direction 14 is referred to as a third direction 16.

A carrier 130 in which a substrate W is stored is seated on the load port 120. The load port 120 is provided with a plurality of numbers and they are arranged in a line along the second direction 14. The number of load ports 120 may be increased or decreased depending on a requirement like process efficiency and a foot print of the process treating module 20. A plurality of slots (not described) are provided in the carrier 130 to support an edge of the substrate W. As the carrier 130, a front opening unified pod (FOUP) may be used.

The process treating module 20 comprises a buffer unit 220, a transfer unit 240, and a process chamber 260. The transfer unit 240 is provided such that the lengthwise direction thereof is parallel with the first direction 12. The process chambers 260 are provided in one side and the other side of the transfer unit 240 along the second direction 14. The process chamber 260 placed in one and the other sides of the transfer unit 240 are provided symmetrical to each other based on the transfer unit 240. Some of the process chambers 260 are placed along the lengthwise direction of the transfer unit 240. Also, some of the process chambers 260 are placed vertically stacked to each other along the third direction. That is, in one side of the transfer unit 240, the process chambers 260 may be arranged in A×B (A and B are natural number of 1 or above) array. Herein, A is the number of the process chambers 260 which are provided along the direction 12, and B is the number of the process chambers 260 which are provided along the third direction 16. When four or six of the process chambers 260 are provided in one side of the transfer unit 240, the process chambers 260 may be arranged in 2×2 or 3×2 arrays. The number of the process chamber 260 may be increased or decreased. Unlike this, the process chamber 260 may be provided only on one side of the transfer unit 240. Also, unlike this the process chamber 260 may be provided as a single layer at both sides of the transfer unit 240.

The buffer unit 220 is arranged between the transfer frame 140 and the transfer unit 240. The buffer unit 220 provides a space for the substrate W to stay temporarily before transferring the substrate W between the transfer unit 240 and the transfer frame 140. The slot (not described) where the substrate places is provided inside of the buffer unit 220, and the slot (not described) is provided with a plurality of numbers spaced apart from each other along the third direction 16. One side of the buffer unit 220 facing the transfer frame 140, and the other side of the buffer unit 220 facing the transfer frame 140 are opened.

The transfer frame 140 transfers the substrate W between the buffer unit 220 and the carrier 130 seated on the load port 120. In the transfer frame 140, an index rail 142 and an index robot 144 are provided. The index rail 142 is provided such that the lengthwise direction is parallel to the second direction 14. The index robot 144 is installed on the index rail 142, and move linearly along the index rail 142 to the second direction 14. The index robot 144 comprises a base 144a, a body 144*b*, and an index arm 144*c*. The base 144*a* is installed movably along the index rail 142. The body 144*b* is coupled to the base 144*a*. The body 144*b* is provided movably along the third direction 16 on the base 144*a*. Also, the body 144*b* is provided rotatable on the base 144*a*. The index arm 144*c* is coupled to the body 144*b*, and is provided to move front and back to the body 144*b*. The index arm 144*c* is provided with a plurality of numbers and to drive separately, respectively. The index arms 144*c* are arranged vertically, i.e., spaced apart from each other along the third direction 16. Some of the index arms 144*c* may be used when transferring the substrate W from the process treating module 20 to the carrier 130, and some of the index arms 114*c* may be used when transferring the substrate W from the carrier 130 to the process treating module 130. This may prevent a particle generated from a wafer W before a treating process from sticking to a substrate W after a treating process, during the first index robot 144 carries in or carries out the substrate W.

The transfer unit 240 transfers the substrate W between the process chambers 260, and between the buffer unit 220 and the process chamber 260. A guide rail 242 and a main robot 244 are provided in the transfer unit 240. The guide rail 242 is placed such that the lengthwise direction is parallel with the first direction 12. The main robot 244 is installed on the guide rail 242, and moves linearly along the first direction 12 on the guide rail 242. The main robot 244 comprises a base 244*a*, a body 244*b*, and a main arm 244*c*. The base 244*a* is installed movably along the guide rail 242. The body 244*b* is coupled to the base 244*a*. The body 244*b* is provided movably along the third direction 16 on the base 244*a*. Also, the body 244*b* is provided rotatable on the base 244*a*. The main arm 244*c* binds to the body 244*b*, and is provided to move front and back to the body 244*b*. The main arm 244*c* is provided with a plurality of numbers and provided to drive separately, respectively. The main arms 244*c* are arranged vertically, i.e., spaced apart from each other along the third direction 16.

A substrate treating apparatus 300 is provided to perform liquid treatment process to the substrate W in the process chamber 260. The substrate treating apparatus 300 may have different structure based on kinds of cleaning process performed. Unlike this, the substrate treating apparatus 300 in each of the process chambers 260 may have the same structure. In some embodiments, the process chambers 260 are divided into a plurality number of groups, and the process chambers 260 belonging to the same group may have the same structure, and the process chambers 260 belonging to different groups may have different structures.

Figure 4:
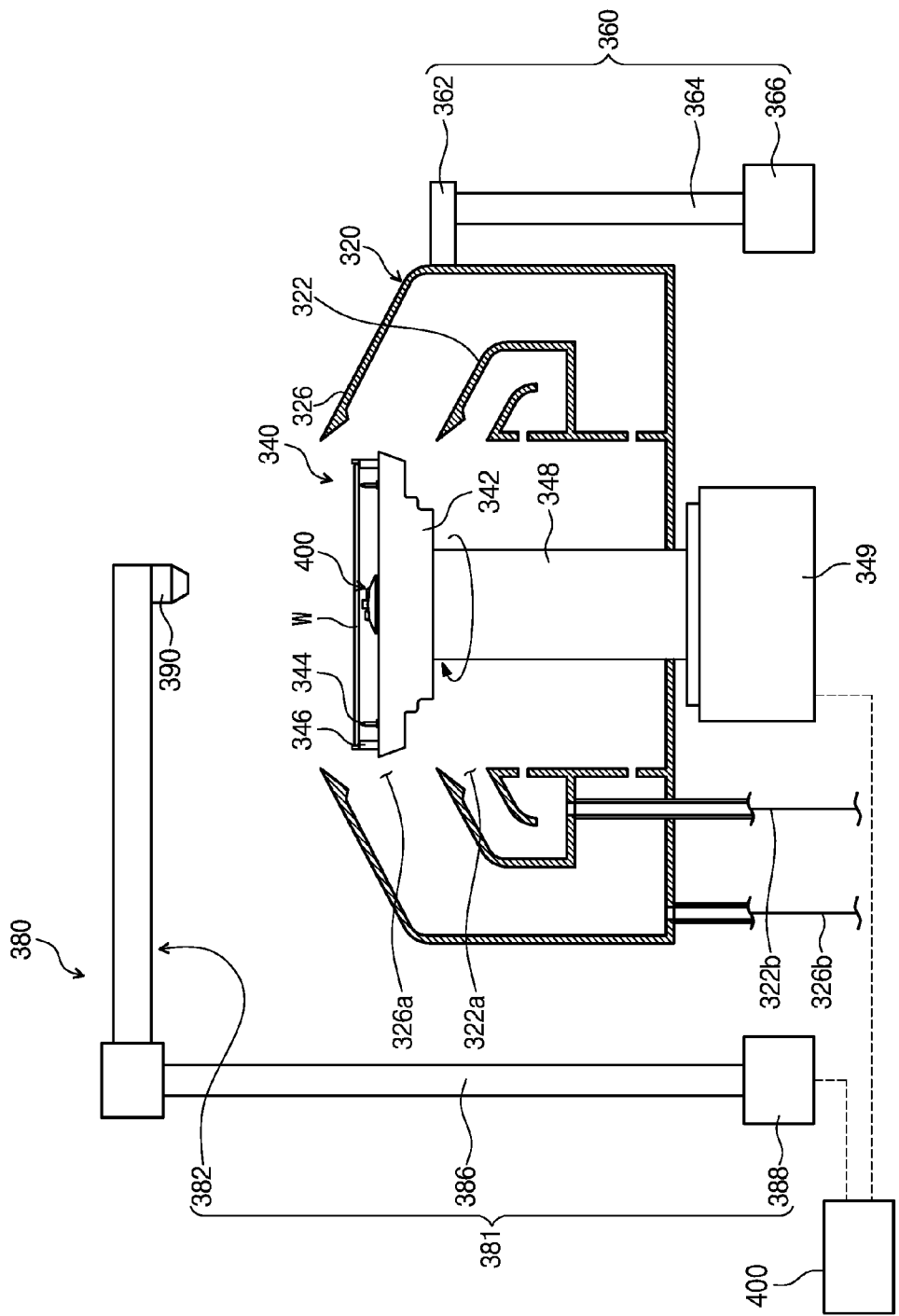
FIG. 4 is a cross sectional view of a substrate treating apparatus of FIG. 3.

The substrate treating apparatus 300 treats the substrate W with a liquid. A liquid treatment process of the substrate will be described as an example of a cleaning process. This liquid treatment process is not limited to the cleaning process but may be applied to photolithography, ashing, etching, and etc. FIG. 4 is a cross sectional view of a substrate treating apparatus of FIG. 3. Referring to FIG. 4, the substrate treating apparatus 300 comprises a treatment container 320, a substrate supporting unit 340, an elevator unit 360, a top liquid supply unit 380 and a bottom liquid supply unit 400.

The treatment container 320 provides a treating space in which substrate treating process is performed. The treatment container 320 has an open upper side. The treatment container 320 comprises an inner collecting container 322 and an outer collecting container 326. Each collecting containers 322, 326 collects a treatment liquid that are different from each other among treatment liquids used in a process. The inner collecting container 322 is provided with a ring shape surrounding the substrate supporting unit 340. The outer collecting container 326 is provided with a ring shape surrounding the inner collecting container 322. An inner space 322*a* of the inner collecting container 322 and the inner collecting container 322 may function as a first inlet 322*a* through which a treatment liquid flows into the inner collecting container 322. An interspace 326*a* between the inner collecting container 322 and the outer collecting container 326 may function as a second inlet 326*a* through which a treatment liquid flows into the outer collecting container 326. In an example, each of the inlets 322*a*, 326*a* may be positioned in different heights from each other. To the collecting containers 322, 326, collecting lines 322*b*, 326*b* are connected respectively. Collecting lines 322*b*, 326*b* emit the treatment liquid inflow through the collecting containers 322, 326, respectively. The emitted treatment liquid may be reused through a treatment liquid regeneration system (not described) of outside.

The substrate supporting unit 340 supports the substrate W in the treating space. The substrate supporting unit 340 supports the substrate W and rotates the substrate W during a process. The substrate supporting unit 340 comprises a supporting plate 342, a supporting pin 344, a chuck pin 346, and a rotary drive member. The supporting plate 346 is provided with a circular plate shape and comprises an upper side and a bottom side. The bottom side has smaller diameter than the upper side. The upper side and the bottom side are positioned such that their center axis are the same.

The supporting pin 344 is provided with a plurality of numbers. The plurality of supporting pins 344 are spaced apart from each other on edge of the upper side of the supporting plate 342 and protrude upward from the supporting plate 342. The supporting pins 344 are generally arranged to have a ring shape. The supporting pin 344 supports the back side of the substrate W as to be spaced apart from the upper surface of the supporting plate 342.

The chuck pin 346 is provided as a plurality number. The chuck pin 346 is arranged further apart from a center of the supporting plate 342 than the supporting pin 344. The chuck pin 346 is provided as to protrude upward from the upper side of the supporting plate 342. The chuck pin 346 supports lateral part (side) of the substrate W such that the substrate W does not deviate from a right position to a side direction when the substrate supporting unit 340 is rotating. The chuck pin 346 is provided to move between outer position and inner position along a radius direction of the supporting plate 342. The outer position is further apart from a center of the supporting plate 342 than the inner position. When loading and unloading the substrate W on and from the substrate supporting unit 340, the chuck pin 346 is placed on the outer position, and when processing the substrate W, the chuck pin 346 is placed on the inner position. The inner position is where the chuck pin 346 is contacted with a lateral part of the substrate W and the outer position is where the chuck pin 346 and the substrate W are spaced apart from each other.

Rotary drive members 348, 349 rotate the supporting plate 342. The supporting plate 342 may rotate around a center of its shaft by rotary drive member 348, 349. Rotary drive members 348, 349 comprise a supporting shaft 348 and a drive part 349. The supporting shaft 348 is provided as a cylinder shape such that its lengthwise direction is parallel with the third direction 16. A top of the supporting shaft 348 is fixedly connected to a bottom of the supporting plate 342. In an example, the supporting shaft 348 may be fixedly connected to a center of the bottom of the supporting plate 342. The drive part 349 provides a driving power to rotate the supporting shaft 348. The supporting shaft 348 is rotated by the drive part 349 and the supporting plate 342 is rotatable with the supporting shaft 348.

The elevator unit 360 moves the treatment container 320 linearly to up and down direction. As the treatment container 320 moves up and down, a height of the treatment container 320 relative to the supporting plate 340 is changed. When the substrate W is loaded/unloaded on/from the supporting plate 340, the elevator unit descends the treatment container 320 such that the supporting plate 340 protrudes upward from the treatment container 320. Also, during processing, the height of the treatment container 320 are controlled such that treatment liquid flows into the predetermined collecting container 360 depending on a kind of treatment liquid supplied in substrate W. The elevator unit 360 comprises a bracket 362, a moving shaft 364, and a driver 366. The bracket 362 is fixedly installed on outer wall of the treatment container 320. In the bracket 362, the moving shaft 364 moving up and down direction by the driver 366 is fixedly connected. In one embodiment, the elevator unit 360 may move the supporting plate 340 up and down direction.

The top liquid supply unit 380 supplies treatment liquid to an upper side of the substrate W. The upper side of the substrate may be a patterned surface on which a pattern is formed. The top liquid supply unit 380 is provided with a plurality numbers and each may supply different kinds of treatment liquids. The top liquid supply unit 380 includes a moving member 381 and a nozzle 390.

The moving member 381 moves the nozzle 390 to a processing position and a standby position. In the processing position, the nozzle 390 is located at a position facing the substrate W supported on the substrate supporting unit 340, and the standby position refers to a position where nozzle is out of the processing position. In an example, the processing position includes pre-treatment position and post-treatment position. Pre-treatment position refers to a position on which the nozzle 390 supplies treatment liquid to a first supply position, and post-treatment position refers to a position on which the nozzle 390 supplies treatment liquid to a second supply position. The first supply position may be closer to a center of the substrate than the second supply position and the second supply position may be a position including an end of the substrate. In one embodiment, the second supply position may be closer to an end of the substrate.

The moving member 381 includes a supporting shaft 386, an arm 382, and a driver 388. The supporting shaft 386 places on one side of a treatment container 320. The supporting shaft 386 has a rod shape and provided such that its lengthwise direction is parallel with the third direction. The supporting shaft 386 is provided as to rotate by the driver 388. The supporting shaft 386 is provided to move up and down. The arm 382 is perpendicularly connected to the top of the supporting shaft 386. At the end of the arm 382, the nozzle 390 is fixedly connected. As the supporting shaft 386 rotates, the nozzle 390 together with the arm 382 swings. The nozzle 390 may swing to the processing position and the standby position. In one embodiment, the arm 382 may be provided to move forward or backward along its length direction. When viewed from the top, the nozzle 390 in the processing position may be placed at the same place with the center axis of the substrate W. For example, treatment liquid may be a chemical, a rinse liquid, or an organic solvent. Chemicals may be etching liquid having acid or base property. Chemicals may include $H_2SO_4$, $P_2O_5$, and $NH_4OH$. The rinse liquid may be pure water, deionized water, and the organic solvent may be an isopropyl alcohol (IPA).

The bottom liquid supply unit 400 cleans a bottom of the substrate W. The bottom liquid supply unit 400 supplies a liquid to the bottom of the substrate W.

Figure 5:
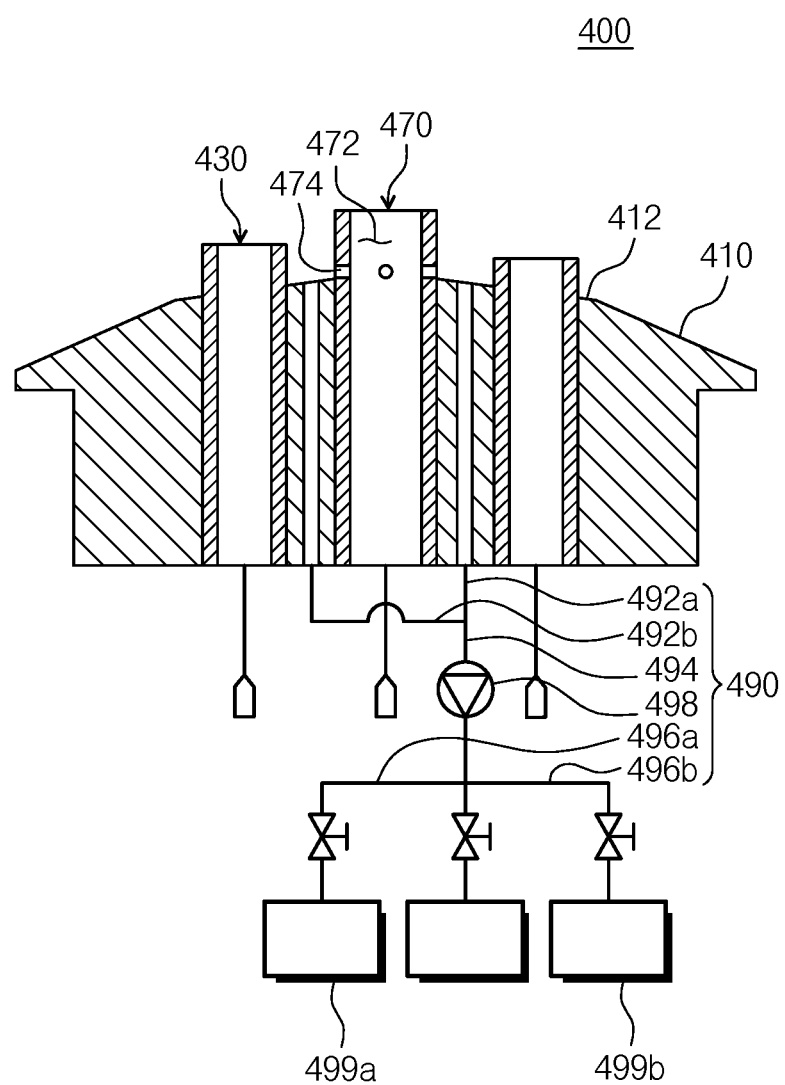
FIG. 5 is a cross sectional view of a bottom liquid supply unit of FIG. 4.
Figure 6:
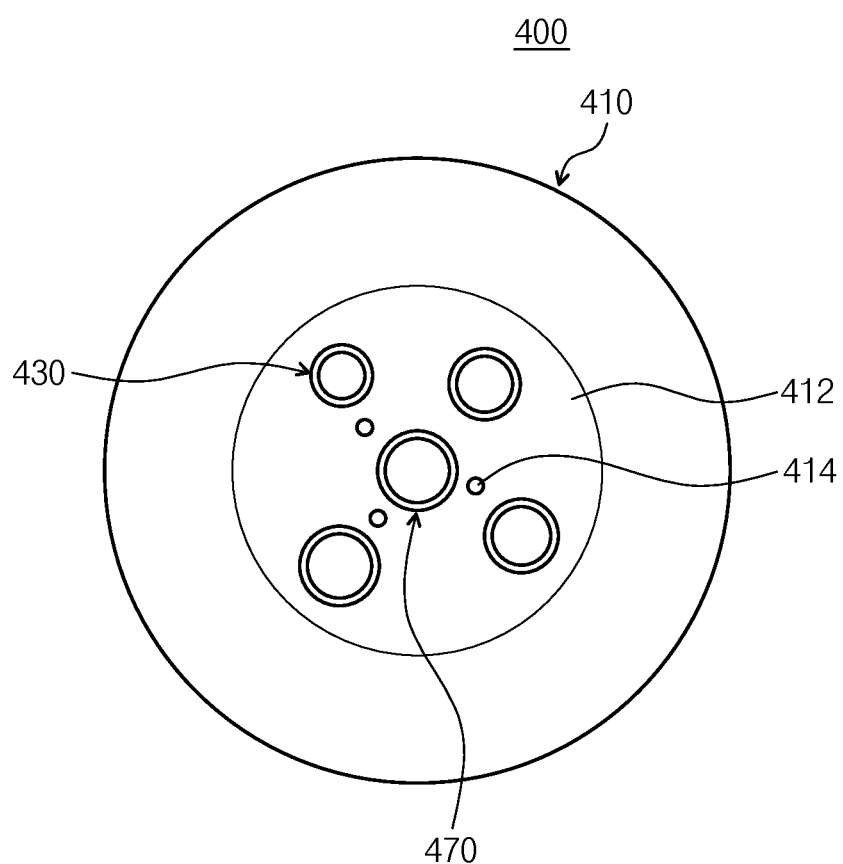
FIG. 6 is a plan view of a bottom liquid supply unit of FIG. 5.
Figure 7:
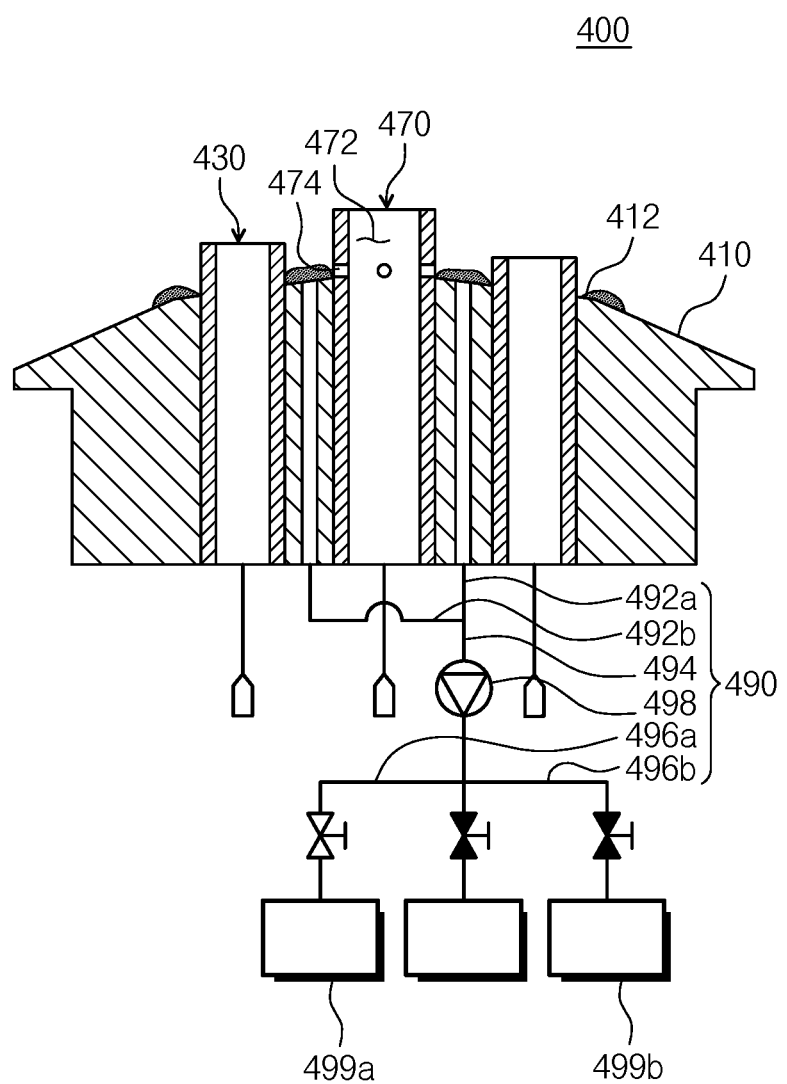
FIGS. 7 and 8 show process of removing a liquid which is remained in the body of FIG. 5 by a gas discharged from a lateral discharge line.
Figure 8:
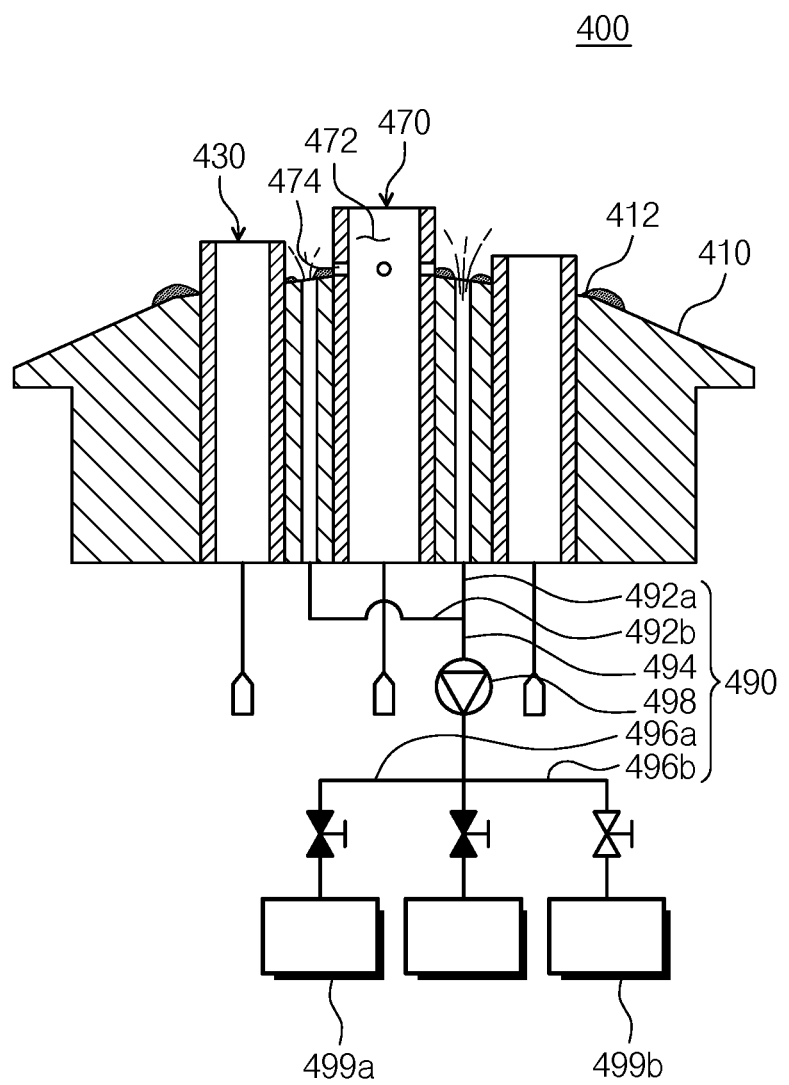

The bottom of the substrate W may be a non-patterned surface opposite to the top having a patterned surface. The bottom liquid supply unit 400 may supply a liquid at the same time with the top liquid supply unit 380. FIG. 5 is a cross sectional view of a bottom liquid supply unit of FIG. 4. FIG. 6 is a plan view of a bottom liquid supply unit of FIG. 5. Referring to FIGS. 5 and 6 the bottom liquid supply unit 400 comprises a body 410, a liquid discharge nozzle 430, a gas nozzle 470, and a suction member 490.

The body 410 is position between the supporting plate 342 and the substrate W supported by the supporting plate 342. When viewed from a top side, the body may be positioned concentrically with the supporting plate 342. The body 410 may be placed independently with the supporting plate 342. The body 410 may be placed not to be affected by a rotation of the supporting plate 342. The body 410 may be spaced apart from the supporting plate 342 while being inserted in the supporting plate 342 at the center area of the supporting plate 342. The body 410 is provided with a circular plate shape having an upper side 412 and a bottom side. The upper side 412 of the body 410 is provided to form to incline downward from the center of body 410, e.g., convex upper side. The bottom surface of the body 410 is provided to have a larger diameter than the upper side of the body 410. The bottom surface of the body 410 has a smaller diameter than the supporting plate 342. The upper side 412 of the body 410 protrudes upward from the supporting plate 342.

The liquid discharge nozzle 430 supplies a treatment liquid to a bottom of the substrate W. A liquid discharged from the liquid discharge nozzle 430 cleans the bottom of the substrate W. The liquid discharge nozzle 430 has an outlet for discharging liquid and facing upward. For example, the outlet of the liquid discharge nozzle 430 may be provided to face upward vertically. The liquid discharge nozzle 430 is provided with a plurality of numbers and each of the liquid discharge nozzles 430 may discharge liquids different from each other. The liquid discharge nozzles 430 are fixedly connected to the body 410. The liquid discharge nozzles 430 are positioned i.e. spaced apart from a center of the body 410. The liquid discharge nozzles 430 are arranged around the center of the body 410, e.g., to surround a center of the body 410. The liquid discharge nozzles 430 may be arranged to have a circular ring shape. Treatment liquid discharged from the liquid discharge nozzle 430 may comprise a chemical and a rinse liquid. Chemicals may be etching liquid having acid or base property. Chemicals may include $H_2SO_4$, $P_2O_5$, HF, and $NH_4OH$. The rinse liquid may be $H_2O$, deionized water. In one embodiment, the liquid discharge nozzle 430 may be arranged such that a liquid passage thereof is perpendicular to the bottom surface of the substrate or is not perpendicularly, e.g., the liquid discharge nozzle 430 is oblique such that the outlet of the liquid discharge nozzle 430 is away from the center of the body 410.

The gas nozzle 470 discharges a gas. The gas nozzle 470 is fixedly connected to the upper side 412 of the body 410. The gas nozzle 470 is placed on a center axis of the body 410. The gas nozzle 470 discharges a gas along more than two directions. A top discharge line 472 and a lateral discharge line 474 are provided in a top of the gas nozzle 470. The top discharge line 472 comprises a top outlet at a top end of the gas nozzle 470 and the lateral discharge line 474 comprises a lateral outlet at a sidewall (lateral portion)

of the gas nozzle 470. The top outlet of the top discharge line 472 may be provided to face vertical top, e.g., facing the bottom of the substrate W. A gas discharged from the top discharge line 472 is supplied to the bottom of the substrate W. A gas discharged from the top discharge line 472 dries the bottom of the substrate W. For example, gas may be an inert gas or air. The inert gas may be a $N_2$.

The lateral discharge line 474 is provided to be perpendicular to the top discharge line 472. The lateral discharge line 474 is provided with a plurality of numbers. Each of the lateral discharge lines 474 may be branch off from the top discharge line 472. A gas discharged from the lateral discharge line 474 removes a liquid remaining in the body 410 like FIGS. 7 and 8. A gas discharged from the lateral discharge line 474 blows a liquid remaining in the body 410. The lateral discharge lines 474 are formed along the circumference of the sidewall of the gas nozzle 470. Each of the lateral discharge lines 474 is positioned at the same height with each other. Each of the lateral discharge lines 474 is positioned adjacently to the upper side 412 of the body 410. According to an example, each of the lateral discharge lines 474 may be positioned close to the upper side 412 of the body 410 than a top of the gas nozzle 470.

In some embodiments, the lateral discharge line 474 may not be perpendicular to the top discharge line 472. The lateral discharge line 474 may be form to incline downward from the center axis of body 410 A gas discharged from the lateral discharge line 474 may be directed to the upper side 412 of the body 410 at an inter area between the gas nozzle 470 and the lateral discharge line 474 or an inter area between the gas nozzle 470 and a drainage hole 414. The lateral discharge line 474 may discharge a gas laterally and/or obliquely (downwardly) to remove liquid remaining in the body 410.

The suction member 490 removes a liquid remaining in the body 410. The suction member 490 sucks a liquid remaining in the body 410. The suction member 490 provides a negative pressure to the drainage hole 414 formed in the body 410. Before explaining the suction member 490, the drainage hole 414 formed in the body will be explained. The drainage hole 414 is formed in the upper side 412 of the body 410. A liquid remaining in the upper side 412 of the body 410 is discharged through the drainage hole 414. The drainage hole 414 is provided with a plurality of numbers. When viewed from a top side, the drainage holes 414 are positioned to surround the gas nozzle 470 (see FIG. 6). The drainage holes 414 may be arranged to have a circular ring shape. According to an example, the drainage hole 414 may be positioned between the gas nozzle 470 and the liquid discharge nozzle 430. Remaining liquid may be sucked to the drainage hole 414 or may be blown to an outer part of the body 410 by a gas.

The suction member 490 comprises a discharge line 492, an integrate line 494, a branch line 496, and a negative pressure member. The suction member 490 is provided with a plurality of numbers. The number of the suction member 490 corresponds to to the number of the drainage hole 414. The discharge line 492 is connected to the drainage hole 414 to be one to one correspondence. The integrate line 494 is provided to be connected with each of the discharge lines 492. The discharge lines 492 may be integrated to the integrate line 494. The negative pressure member is installed in the integrate line 494. A negative pressure provided from the negative pressure member is provided to each of the drainage holes 414. The branch line 496 is provided as a line branch off from the integrate line 494. Each of the branch lines 496 is connected to a respective collecting container 499. According to an example, the branch lines 496 may be provided with the number corresponding to kinds of discharged liquid from the liquid discharge nozzles 430. The branch lines 496 guide liquids to be discharged so that liquids discharged from each of the collecting containers 499 may be discharged with different kinds of liquids. A valve is installed in each of the branch lines 496. Each of the valves is opened and closed by a controller (not described). Each of the valves is possible to be driven independently.

Figure 9:
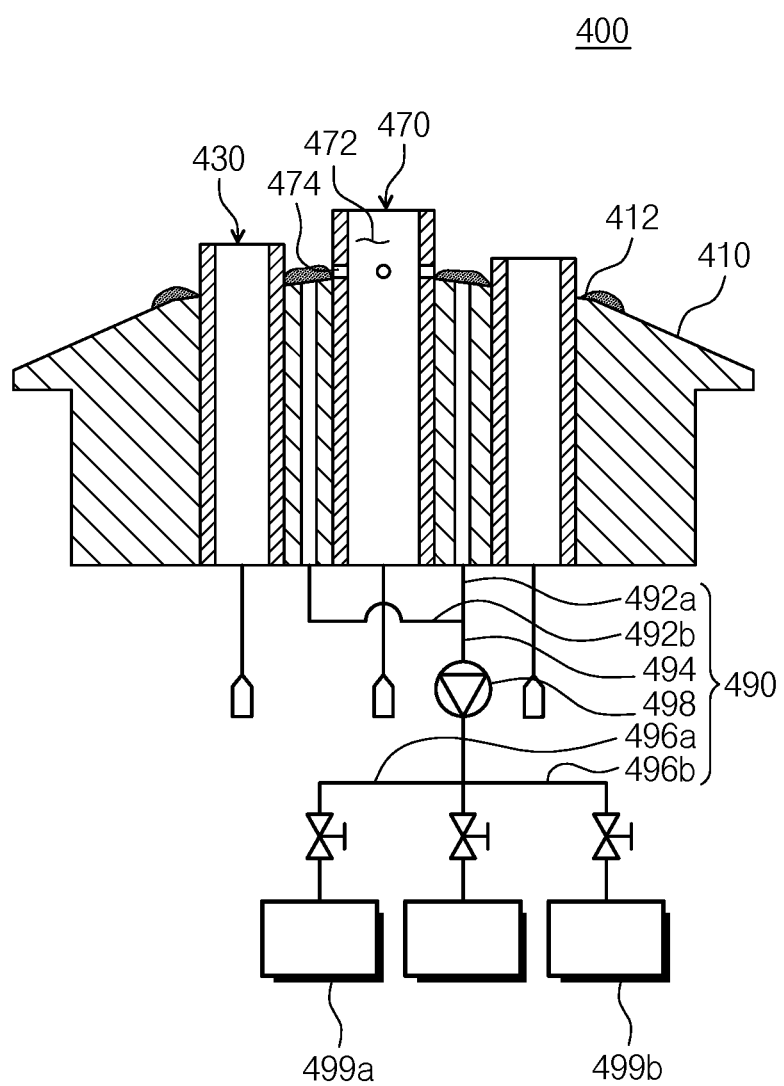
FIGS. 9 and 10 show process of removing a liquid which is remained in the body of FIG. 5 by a gas discharged from a drainage hole.
Figure 10:
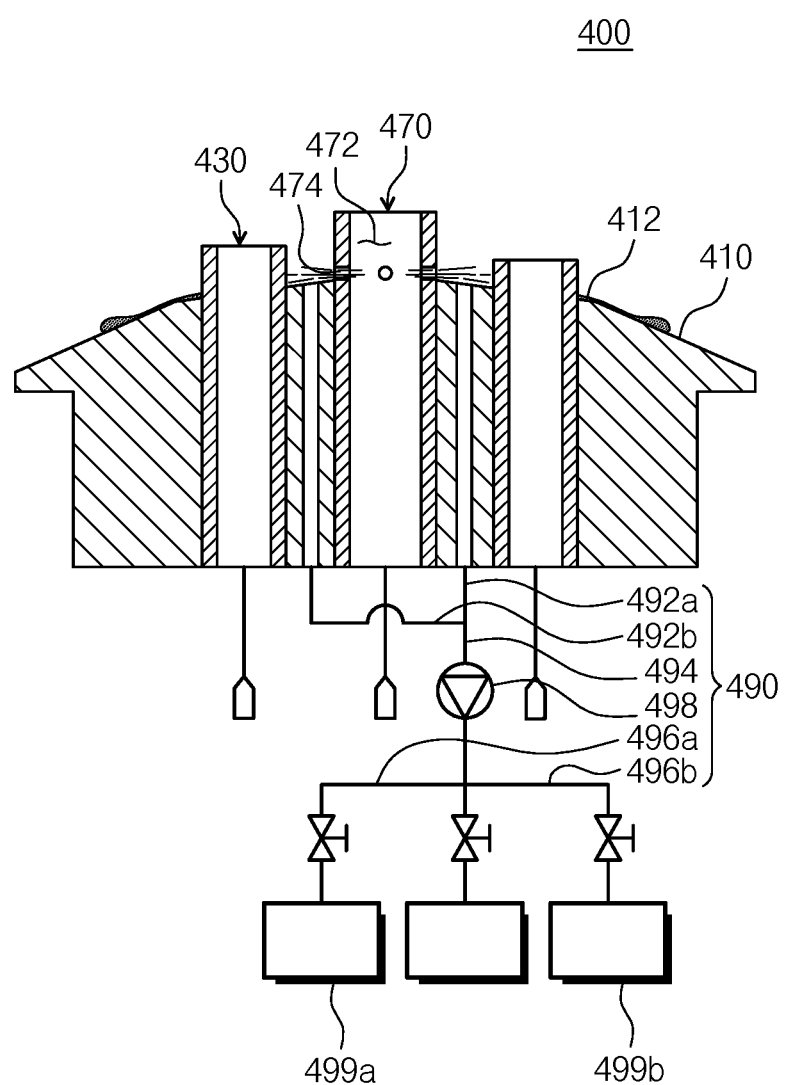

According to an example, as shown in FIGS. 9 and 10, when a chemical is discharged from the liquid discharge nozzle 430, a first branch line 496a among the branch lines 496 is opened and the chemical may be discharged to a first collecting container 499a connected with the first branch line 496a. Also when a rinse liquid is discharged from the liquid discharge nozzle 430 a second branch line 496b different from the first branch line 496a is opened and the rinse liquid may be discharged to a second collecting container 499b connected with the second branch line 496b.

In the embodiments described above, a gas is discharged from the lateral discharge line 474 of the gas nozzle 470 to remove a liquid remaining in the body 410 and the liquid is discharged through the drainage hole 414. However, the bottom liquid supply unit 400 may be provided with only one of the lateral discharge line 474 and the drainage hole 414.

Figure 11:
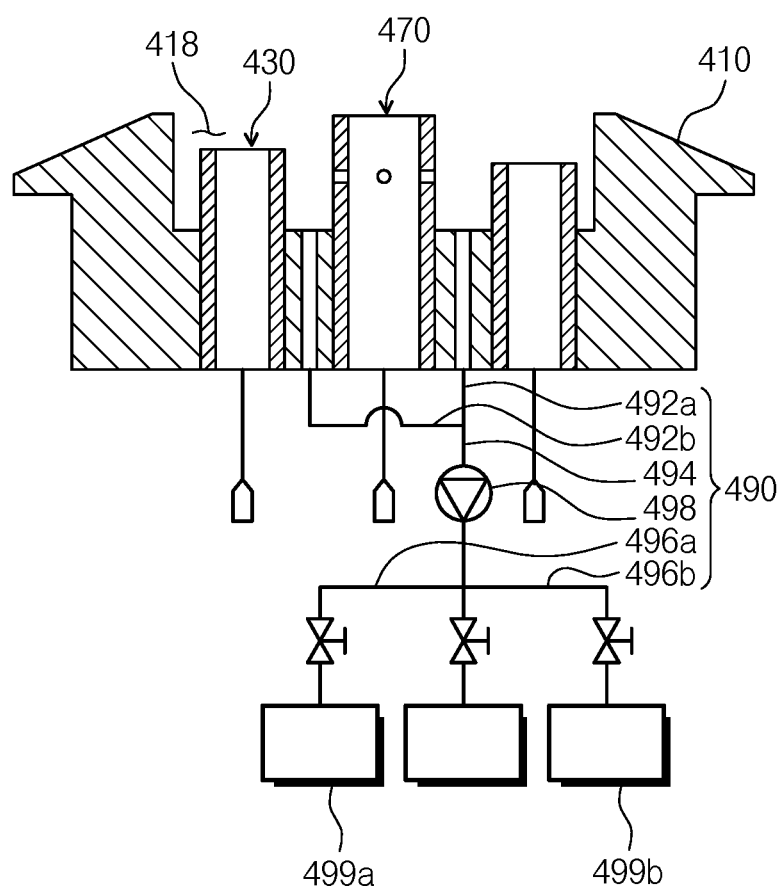
FIG. 11 is a cross sectional view of another embodiment of the body of FIG. 5.

Also like FIG. 11, a top groove 418 may be formed in the upper side 412 of the body 410. The top groove 418 may be defined an inner surface (sidewall) and a bottom surface. The top groove 418 may be provided with the liquid discharge nozzles 430 and the gas nozzle 470. The drainage hole 414 may be formed at the bottom surface. Therefore, a liquid remained in the top groove 418 is discharged through the drainage hole 414 and even if some of the remained liquids may scattered it may prevent attaching to a bottom of the substrate W.

Figure 12:
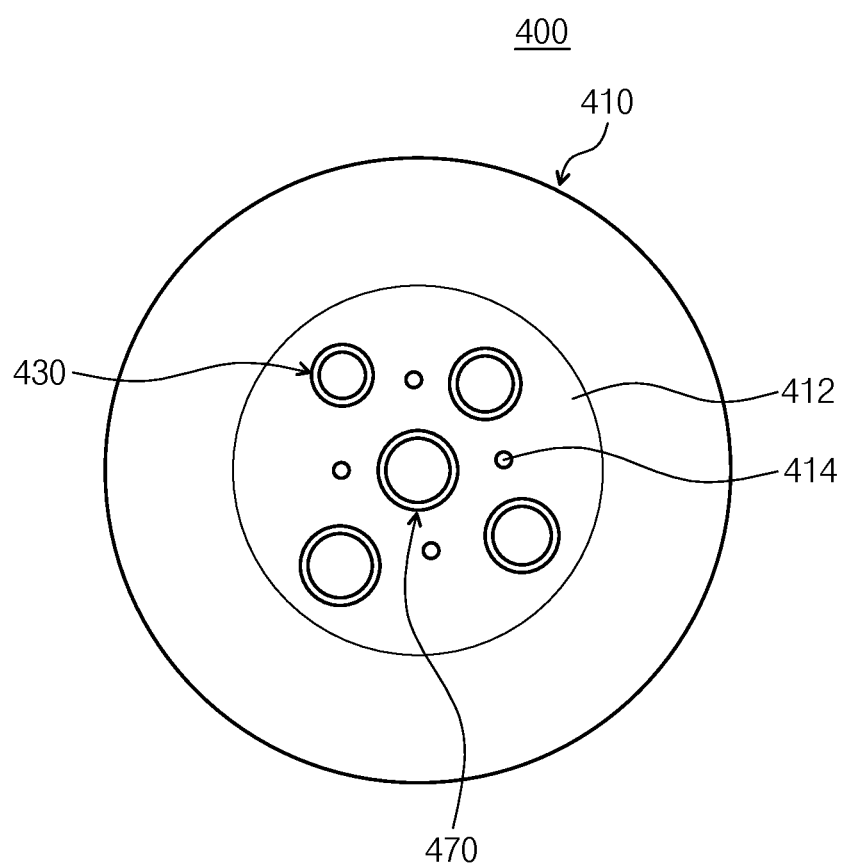
FIG. 12 is a plan view of another embodiment of the drainage hole of FIG. 6.

Also like FIG. 12, the drainage hole 414 may be positioned between two adjacent liquid discharge nozzles 430.

Figure 13:
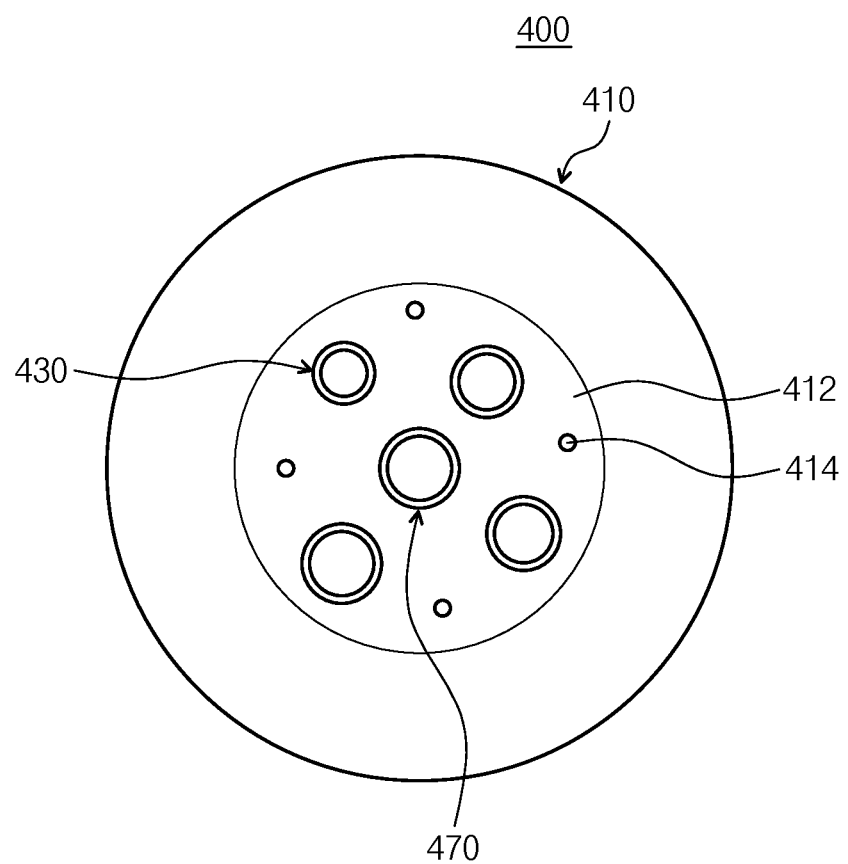
FIG. 13 is a plan view of the other embodiment of the drainage hole of FIG. 6.

Also like FIG. 13, the drainage hole 414 may be positioned spaced further apart from a center of the body 410 than the liquid discharge nozzles 430.

In some embodiments, the drainage hole 414 may be formed between the gas nozzle 470 and the liquid discharge nozzle 430, between the two adjacent liquid discharge nozzles 430, and further apart from a center of the body 410 than the liquid discharge nozzles 430.

What is claimed is:

1. A substrate treating apparatus comprising:
a substrate supporting unit comprising a supporting plate for supporting a substrate; and
a bottom liquid supply unit for supplying a liquid to a bottom of the substrate supported by the supporting plate;
wherein the bottom liquid supply unit comprises a body and a liquid discharge nozzle coupled to the body and for discharging a treatment liquid to the bottom of the substrate,
wherein a drainage hole for draining a liquid remaining in the body is formed in the body, and
wherein the body is inserted in the supporting plate such that an upper side of the body protrudes upward from the supporting plate.

2. The apparatus of claim 1, wherein the bottom liquid supply unit further comprises a suction member for providing a negative pressure to the drainage hole.

3. The apparatus of claim 1, wherein the bottom liquid supply unit includes a plurality of liquid discharge nozzles and the drainage hole is positioned between two adjacent liquid discharge nozzles.

4. The apparatus of claim 1, wherein the bottom liquid supply unit includes a plurality of liquid discharge nozzles and the drainage hole is positioned between a center axis of the body and at least one liquid discharge nozzle.

5. The apparatus of claim 1, wherein the bottom liquid supply unit includes a plurality of liquid discharge nozzles and the drainage hole is positioned further apart from a center of the body than the liquid discharge nozzles.

6. The apparatus of claim 1, wherein an outlet of the liquid discharge nozzle is positioned higher than the drainage hole.

7. The apparatus of claim 1, wherein the bottom liquid supply unit further comprises a gas nozzle containing a lateral discharge line for discharging laterally and/or obliquely a gas and coupled to the body, and wherein the lateral discharge line is provided to penetrate an sidewall of the gas nozzle.

8. The apparatus of claim 7, wherein the gas nozzle further comprises a top discharge line for discharging upwardly a gas to the bottom of the substrate.

9. The apparatus of claim 8, wherein the lateral discharge line is branched off from the top discharge line.

10. The apparatus of claim 9, wherein the gas nozzle is positioned closer to a center axis of the body than the liquid discharge nozzle, when viewed from a top side, and wherein a plurality of lateral discharge lines are provided spaced apart along an outer circumference of the gas nozzle.

11. The apparatus of claim 10, wherein the liquid discharge nozzles are positioned to surround the gas nozzle, when viewed from a top side.

12. The apparatus of claim 7, wherein the lateral discharge line is provided at a height close to an upper surface of the body and configured to inject a gas in a direction parallel with the upper surface of the body.

13. The apparatus of claim 7, wherein the lateral discharge line is configured to incline downward for a gas to be discharged from the upper side of the body to an interspace between the gas nozzle and the drainage hole.

14. A substrate treating apparatus comprising;
a substrate supporting unit comprising a supporting plate for supporting a substrate; and
a bottom liquid supply unit for supplying a liquid to a bottom of the substrate supported by the supporting plate;
wherein the bottom liquid supply unit comprises a body and a liquid discharge nozzle coupled to the body and for discharging a treatment liquid to the bottom of the substrate,
wherein a drainage hole for draining a liquid remaining in the body is formed in the body, and
wherein a top groove is formed in an upper side of the body, wherein the liquid discharge nozzle is positioned in the top groove, and the drainage hole is formed in a bottom of the top groove.

15. A substrate treating apparatus comprising:
a substrate supporting unit comprising a supporting plate for supporting the substrate; and
a bottom liquid supply unit for supplying a liquid to a bottom of the substrate supported by the supporting plate;
wherein the bottom liquid supply unit comprises a body, a liquid discharge nozzle for discharging a treatment liquid to the bottom of the substrate and coupled to the body, and a gas nozzle coupled to the body and containing a lateral discharge line from which a gas is discharged, and
wherein the lateral discharge line is configured to penetrate an sidewall of the gas nozzle.

16. The apparatus of claim 15, wherein the gas nozzle is positioned closer to a center axis of the body than the liquid discharge nozzle, when viewed from a top side, and wherein a plurality of lateral discharge lines are provided spaced apart along an outer circumference of the gas nozzle.

17. The apparatus of claim 15, wherein a drainage hole for draining a liquid remaining at the body is formed in an upper surface of the body.

18. The apparatus of claim 17, wherein the bottom liquid supply unit further comprises a suction member for providing a negative pressure to the drainage hole.

19. The apparatus of claim 17, wherein the bottom liquid supply unit includes a plurality of liquid discharge nozzles and the drainage hole is positioned between two adjacent liquid discharge nozzles.

20. The apparatus of claim 17, wherein the bottom liquid supply unit includes a plurality of liquid discharge nozzles and the drainage hole is positioned between the gas nozzle and at least one liquid discharge nozzle.

21. The apparatus of claim 17, wherein the bottom liquid supply unit includes a plurality of liquid discharge nozzles and the drainage is positioned further apart from the gas nozzle than the liquid discharge nozzles.

* * * * *